United States Patent [19]

Gunderman et al.

[11] 4,180,177

[45] Dec. 25, 1979

[54] PRESSURE VENT FOR EXPLOSION-PROOF ELECTRICAL ENCLOSURES

[75] Inventors: Robert J. Gunderman, Columbus; Keith Alcock, Upper Arlington; Charles S. Skinner, Northfield; Michael W. Riley, Strongsville, all of Ohio

[73] Assignee: The United States of America as represented by the Secretary of the Interior, Washington, D.C.

[21] Appl. No.: 27,133

[22] Filed: Apr. 4, 1979

[51] Int. Cl.² ..................... F16K 17/12; B65D 25/00
[52] U.S. Cl. .............................. 220/88 A; 227/88 R; 220/231; 227/334; 227/337
[58] Field of Search ................... 220/88 R, 88 A, 231, 220/334, 337

[56] References Cited

U.S. PATENT DOCUMENTS

| 2,151,180 | 3/1939 | Anschicks | 220/88 A |
| 3,095,965 | 7/1963 | Stahl | 220/337 |
| 3,307,303 | 3/1967 | Bloxsom | 220/88 R |
| 3,468,576 | 9/1969 | Beyer | 220/230 |
| 3,502,047 | 3/1970 | Crosbie | 220/88 A |

FOREIGN PATENT DOCUMENTS 900552  7/1962  United Kingdom .................... 220/337

Primary Examiner—George E. Lowrance
Attorney, Agent, or Firm—Thomas Zack; Donald A. Gardiner

[57] ABSTRACT

A vent device for relieving pressure buildup inside an electrical enclosure due to an internal explosion of gases. A mass of stainless steel foam covers an opening in the enclosure and stops any flames or particles from escaping but provides a large equivalent cross section opening to permit the gases to escape and vent the pressure buildup. An outer cover protects the foam mass from impact damage and shields it from high pressure water spray used in cleaning. The cover is vertically hung from a knife-edge and held closed by means of a permanent magnet. A predetermined pressure differential is sufficient to overcome the attractive force of the magnet and allow the protective cover to be pushed open.

7 Claims, 4 Drawing Figures 4,180,177

PRESSURE VENT FOR EXPLOSION-PROOF ELECTRICAL ENCLOSURES

BACKGROUND OF THE INVENTION

The present invention relates generally to a venting apparatus and more particularly to flame arresting venting apparatus.

The Code of Federal Regulations, Title 30, Part 18, states requirements for explosion-proof enclosures for electrically operated machines and accessories intended for use in gassy mines or tunnels. Specifically, such electrical enclosures must be so constructed as to withstand internal explosions of methane-air mixtures (1) without damage to or excessive distortion of walls or covers, and (2) without ignition of surrounding methane-air mixtures or discharge of flame from inside to outside the enclosures. As a result of these requirements, prior art electrical enclosures have usually been very heavy and constructed with close tolerance fits at potential flame paths. Enclosures of the foregoing type have been difficult to handle and repair, particularly in the larger sizes, because of their weight. The close tolerance fits are expensive to manufacture and difficult to maintain. The ability of the enclosures to withstand internal explosive pressure and contain any flame is sometimes questionable, especially after the enclosures are subject to wear.

BRIEF SUMMARY OF THE INVENTION

Accordingly, it is an object of the invention to provide a device for use in an explosion-proof electrical enclosure to relieve internal pressure build-up caused by explosion of a gas and/or dust and air mixture located within the enclosure.

It is another object of the invention to provide such a device capable of arresting flames resulting from the explosion so as not to ignite any material or atmosphere external to the enclosure.

It is yet a further object of the invention to provide such a device whose use in explosion-proof enclosures will permit more satisfactory compliance with federal statutory requirements while allowing lighter weight, more compact and less costly enclosure construction.

The objects of the present invention are achieved by a pressure vent device for an electrical enclosure containing an explosive mixture of gases and/or dust. The pressure vent device includes a vent body adapted to be mounted in a wall or an access door of the electrical enclosure, the vent body having a passageway therethrough, one end of the passageway communicating with the interior of the enclosure, and flame arrestor means comprising a metal foam material affixed to the vent body and positioned within the passageway for stopping flames and hot particles from propagating from the interior of the enclosure through the passageway in the event of an explosion of the mixture of gases in the enclosure, while permitting the gases to propagate therethrough to vent a pressure buildup. The pressure vent device further includes a cover having a face sized to seal off the outer end of the passageway and adapted to fit against a seat to close the passageway for protecting the flame arrestor means against impact damage and/or entry of water from high pressure spray. There is further provided hinge means for retaining one edge portion of the cover in the seat while permitting an opposite edge portion of the cover to swing away from the seat to open the passageway; and latch means for holding the opposite edge portion of the cover against the seat until a predetermined pressure of gases is reached in the enclosure, the opposite edge portion of the cover swinging outwardly against the force of the latch means to relieve the pressure when the pressure of the mixture of gases in the enclosure reaches the predetermined pressure, the cover reclosing upon relief of the pressure in the enclosure to reclose the passageway.

This device provides a means for allowing a large volume, high flow rate for escaping gas. Thus, the pressures generated by an explosion within an enclosure in which the device is mounted are much less than for a standard enclosure. As a result of reduced pressure, the tolerances on cover flange gaps, cable entry seals and other potential flame paths are not as stringent. The protective cover protects the flame arresting material from physical impact damage and shields it from high pressure water spray. The flame arresting material has a low pressure drop characteristic and is virtually self cleaning from clogging material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DETAILED DESCRIPTION OF THE PREFERRED EMBODIMENT

Figure 1:
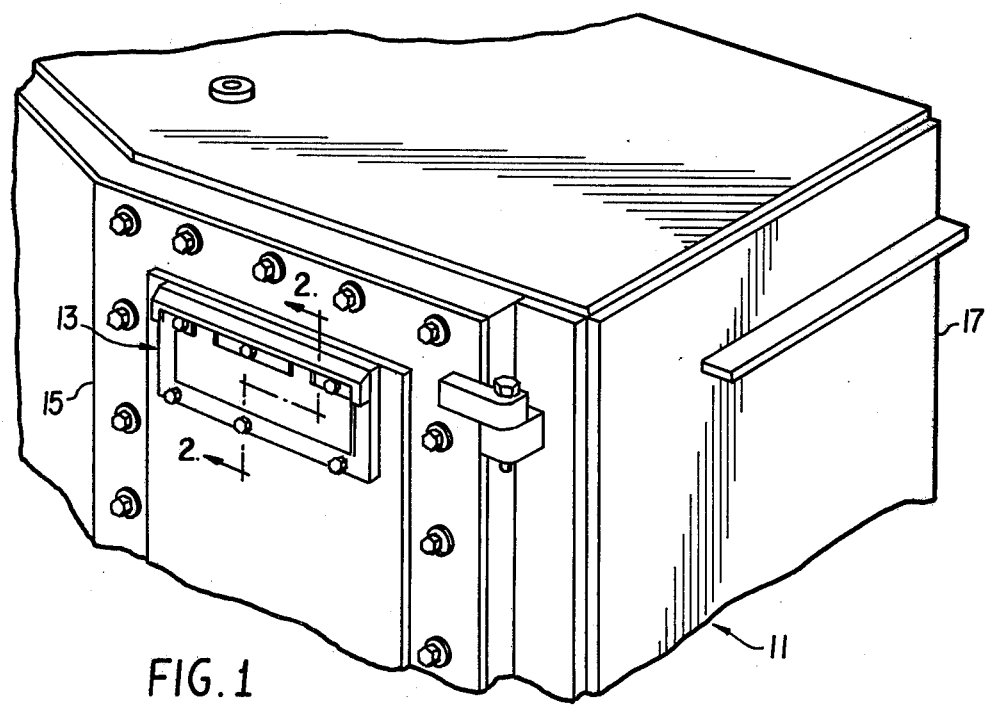
FIG. 1 is a fragmentary perspective view of an electrical enclosure incorporating the pressure vent device of the invention.

Referring to FIG. 1, there is shown an electrical enclosure incorporating the pressure vent device of the present invention. As explained above, this enclosure contains electrically operated apparatus to be used in mines, tunnels, or other enclosed areas where an explosive methane and air atmosphere may be present. An electrical discharge generated by the apparatus can ignite the gases within the enclosure. This enclosure must have sufficiently heavy fabrication so as to contain any resulting explosion and not rupture due to any corresponding increase in the internal pressure. The enclosure 11 is preferably composed of steel and is provided with a bolted access door 15 having an opening therein. While the opening is shown in the access door 15 for purposes of illustration, it is to be understood that the opening may be located elsewhere, as in one of the side walls 17 of the enclosure. It is desirable to improve safety and to reduce stringent requirements on flame-arresting paths and wall thickness by limiting the internal pressure buildup within the enclosure. A pressure vent device 13 is mounted in the opening to prevent the internal pressure of the enclosure from exceeding a predetermined value. Any excess pressure in the enclosure will be vented to the outside atmosphere through flame arresting material by means of the pressure vent device.

Figure 2:
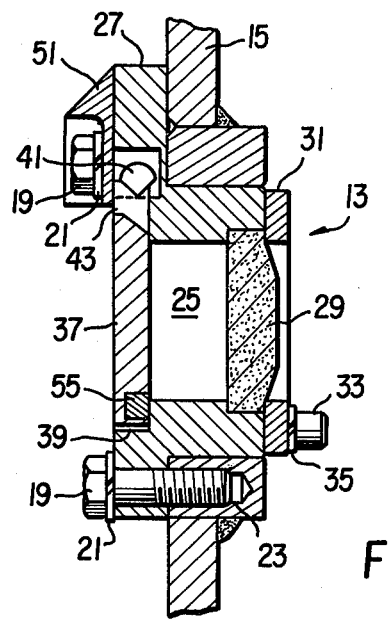
FIG. 2 is a vertical cross-sectional view along 2—2 of FIG. 1 of the pressure vent device.
Figure 3:
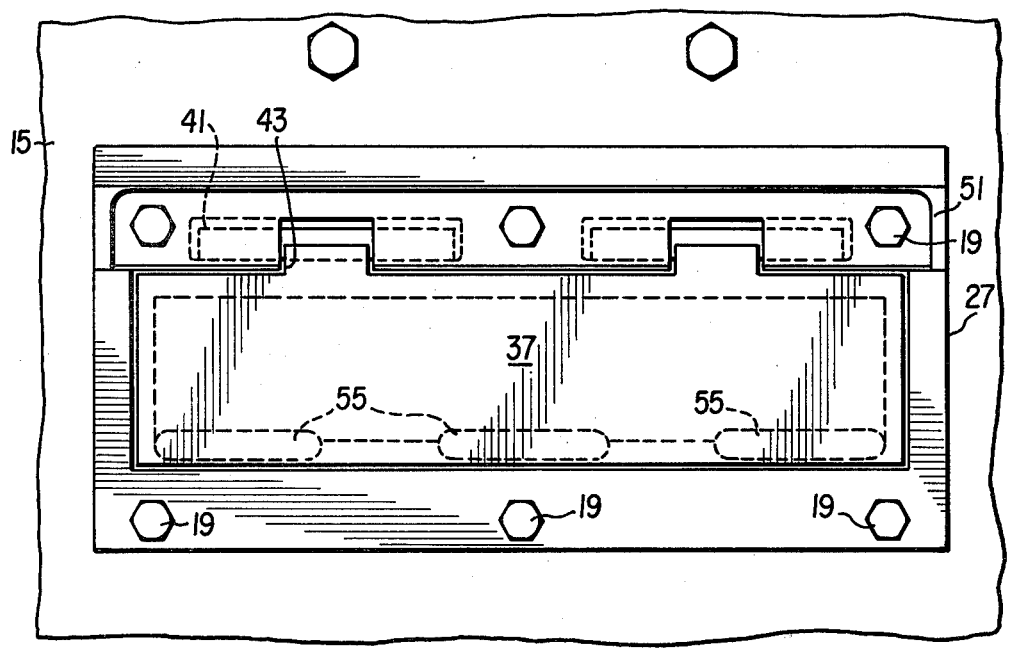
FIG. 3 is a front view of the pressure vent device.
Figure 4:
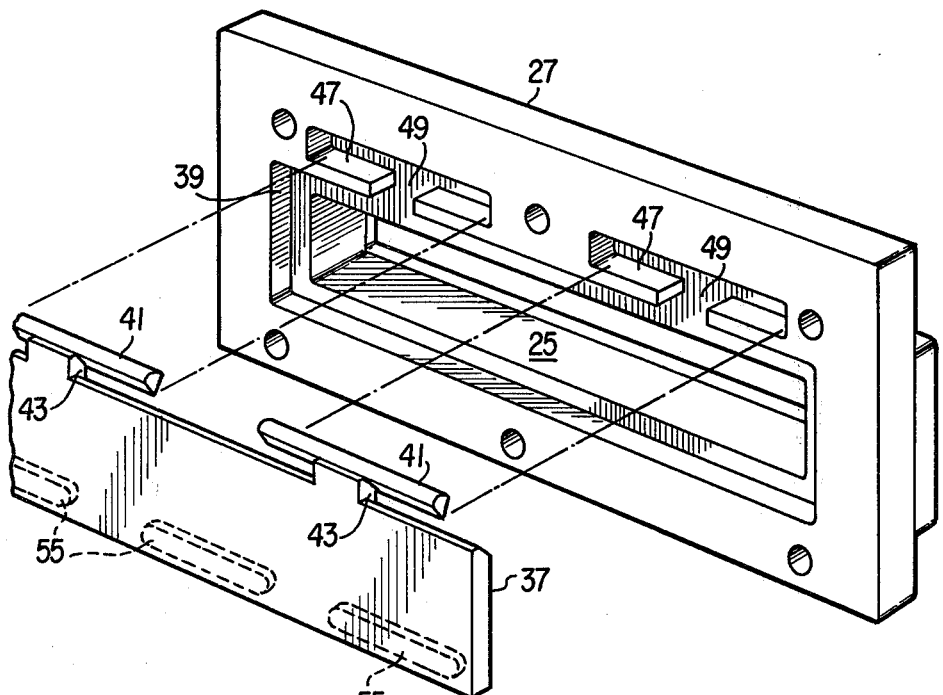
FIG. 4 is an exploded perspective view of the cover and vent body of the pressure vent device.

Referring to FIGS. 2, 3 and 4, the pressure vent device which forms the subject of the invention will now be described in detail. The pressure vent device 13 is shown mounted by bolts 19 with lock washers 21 in the opening in the access door 15. The bolts are threaded in tapped blind holes 23 and the fit between the device and the opening is made flame tight. A passageway 25 is formed through the body 27 of the device so as to communicate with the interior of the enclosure 11. The rear end of the passageway is stepped and a plate 29 of porous flame-arresting material sized to seal off the passageway is positioned in the step and retained under compression therein by a retaining flange 31 secured to the rear of the vent body 27 by cap head screws 33 and washers 35. The plate 29 has a large effective open area for an outflow of gas resulting from an ignition of the gases within the electrical enclosure 11 but will cool the exiting gases and arrest any flame or hot particles.

A stainless steel foam available on the market from Dunlop Ltd., England under the trade name RETIMET is used in preference to any other form of porous flame-arresting material because it is capable of venting a large volume of high temperature gas in a very short period of time. The material has a cellular structure similar to a sponge. It can be made from various metals and alloys with interconnecting cavities having a very high void volume (approximately 95%) and the size of the pore can be varied. A piece 0.51 inches thick will allow air flow through it equivalent to 25% for velocities such as experienced during a methane and air ignition. In other words, a 100 sq. in. plate will be an effective window of 25 sq. in. during the pressure rise. The required size of the plate is a function of the internal volume of the enclosure and the desired pressure relief characteristics. In an actual model designed to vent an internal pressure buildup due to an ignition, the size of the plate 29 was determined on the basis of maintaining the ratio of plate area dimensions to enclosure volume high enough to meet the 12 psi maximum criteria. Survivability of the plate requires an even larger ratio of plate area to enclosure volume to distribute the energy over the area of the plate so that no one part is overheated. The ratio holds constant for different size enclosures because the energy in the ignition is a function of the gas volume. A minimum ratio of 12 to 16 square inches per cubic foot for the ½ inch thick RETIMET appears from experimental data to be satisfactory.

The stainless steel foam is sturdy, but it is not rugged like metal plate. Also, water directed at the material will flow through due to gravitational forces.

To protect the porous flame arresting material of plate 29 from impact damage and entry of water from high pressure spray used for cleaning purposes, the front end of the passageway 25 is provided with a swinging door vent cover 37. A seat 39 is formed in the front of the vent body 27 and cover 37 having a face sized to seal off the passageway is disposed in engagement with the seat. Hinge means are provided for retaining the upper edge of the cover in the seat while permitting the lower edge portion of the cover to swing away from the seat to open the passageway. While the hinge means may take a variety of forms, it may take the form of knife-edged load bearing elements engaging and moving relative to flat bearing surfaces, whereby the cover can align itself on its seat with a minimum of friction and binding. As best shown in FIG. 3, the cover 37 is suspended on laterally projecting knife-edged members 41 which are mounted on extensions 43 of the upper edge portion of the cover. The knife-edged members engage the basal surfaces 47 of slots 49 which are formed as part of the seat in the front of the vent body 27. The space within which the knife-edged members are disposed is covered by a removable cap 51 which retains the knife edges loosely in position while spaced openings in the cap permit the cover extensions 43 to swing outward on the hinge means. Latch means are provided to hold the bottom edge portion of the cover 37 against the seat 39 until a predetermined pressure is reached in the enclosure 11. While the latch means may take a variety of forms, it may take the form illustrated in the drawing of a magnetic latch wherein one or more permanent magnets 55 are disposed in the bottom edge portion of the cover, the vent body being formed from a magnetically susceptile metal, such as steel, to form the strike plate. The magnets 55 are chosen to have sufficient force to releasably retain the cover 11 in closed position.

When an internal explosion of the mixture of gases inside the enclosure 11 occurs, the buildup of pressure occurs in a fraction of a second. The plate 29 of flame arresting material stops any flames or hot particles from propagating from the interior of the enclosure through the passageway 25 but provides a large equivalent cross section opening to permit the gases to escape and vent the pressure buildup. When a predetermined pressure of gases is reached in the enclosure, the lower edge portion of the cover 37 swings outwardly against the force of the magnets 55 to relieve the pressure. Upon relief of the pressure in the enclosure, which in actual practice takes place in less than a second, the cover 37 recloses to reclose the passageway and thereby protect the plate 29 against impact damage and entry of water from high pressure spray.

Obviously, numerous modifications and variations of the present invention are possible in light of the above teachings. Thus, for example, the pressure vent device can be fabricated in a wide range of geometries and need not be rectangular in cross-section. The vent body 27 can be made an integral part of the enclosure. It is therefore to be understood that within the scope of the appended claims, the invention may be practiced otherwise than as specifically described herein.

What is claimed as new and desired to be secured by Letters Patent of the United States is:

1. A pressure vent device, comprising:
   (a) an enclosure for electrical apparatus,
   (b) a vent opening extending from the interior to the exterior of the enclosure,
   (c) flame arrestor means affixed in the opening for preventing flames from propagating through the opening in the event of an explosion of gases in the enclosure while permitting gas to vent through the opening at a predetermined pressure and a flow rate sufficient to preclude a pressure build-up,
   (d) the enclosure including a seat surrounding the opening on the exterior side of the flame arrestor means,
   (e) a cover sized and shaped to close the opening and fit against the seat for protecting the flame arrestor means,
   (f) hinge means for connecting one edge portion of the cover to the enclosure while permitting an opposite edge portion to swing away from the seat,
   (g) releasable latch means for holding said opposite edge portion against the seat until a predetermined pressure is reached in the enclosure,
   (h) closing means for automatically returning said opposite edge portion into contact with the seat after the enclosure pressure drops below said predetermined pressure.

2. The device of claim 1, wherein the flame arrestor means includes a stainless steel foam mesh.

3. The device of claim 1, and further including a vent body connected to a forming part of the enclosure, the opening extending through the body.

4. The device of claim 3, wherein the hinge means includes:

load bearing elements connected to the top of the cover; and flat bearing surfaces formed in the vent body, whereby the cover is suspended from the load bearing elements.

5. The device of claim 3, wherein:

the load bearing elements comprise knife-edged members.

6. The device of claim 1, wherein the latch means includes a magnet disposed in said opposite edge portion of the cover, and a cooperating portion of the enclosure is formed of a magnetically susceptible metal.

7. The device of claim 1, wherein said closing means includes the cover being vertically disposed when said opposite edge engages the seat and the cover having sufficient weight so that it will close by gravity after said pressure drop.

* * * * *